(12) United States Patent
Roberg et al.

(10) Patent No.: US 10,097,164 B2
(45) Date of Patent: Oct. 9, 2018

(54) MONOLITHIC ATTENUATOR, LIMITER, AND LINEARIZER CIRCUITS USING NON-LINEAR RESISTORS

(71) Applicant: Qorvo US, Inc., Greensboro, NC (US)

(72) Inventors: Michael Roberg, Plano, TX (US); Scott Schafer, Plano, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/369,575

(22) Filed: Dec. 5, 2016

(65) Prior Publication Data

US 2017/0366168 A1    Dec. 21, 2017

Related U.S. Application Data

(60) Provisional application No. 62/351,361, filed on Jun. 17, 2016.

(51) Int. Cl.
*H03H 11/24* (2006.01)
*H03F 3/195* (2006.01)
*H03F 3/213* (2006.01)

(52) U.S. Cl.
CPC ............ *H03H 11/24* (2013.01); *H03F 3/195* (2013.01); *H03F 3/213* (2013.01); *H03F 2200/451* (2013.01)

(58) Field of Classification Search
CPC .......... H03F 3/195; H03F 3/213; H03H 11/24
USPC .................................. 327/308, 309, 318, 330
See application file for complete search history.

(56) References Cited

U.S. PATENT DOCUMENTS

| | | | | |
|---|---|---|---|---|
| 4,682,090 A | * | 7/1987 | Schmidt | G01D 5/243 318/636 |
| 5,134,650 A | * | 7/1992 | Blackmon | H04M 11/002 379/106.08 |
| 6,625,276 B1 | * | 9/2003 | Koretsky | H04M 1/573 379/372 |

OTHER PUBLICATIONS

Bouchez, Joseph et al., "A 2-5GHz 100W CW MMIC Limiter using a Novel Input Topology," Compound Semiconductor Integrated Circuit Symposium (CSICS), Oct. 2013, IEEE, 4 pages.
Zhu, Yu et al., "GaAs Resistor Model Predicting Harmonic, Transient and Breakdwon," 2011 European Microwave Integrated Circuits Conference (EuMIC), Oct. 2011, IEEE, 4 pages.

* cited by examiner

*Primary Examiner* — William Hernandez
(74) *Attorney, Agent, or Firm* — Withrow & Terranova, P.L.L.C.

(57) ABSTRACT

Monolithic attenuator, limiter, and linearizer circuitry to be integrated with other circuitry on a chip are provided. According to one aspect, a monolithic attenuator and limiter circuit comprises an input terminal, an output terminal, a first resistor having a first terminal coupled to the input terminal and a second terminal coupled to the output terminal, and a second resistor having a first terminal coupled to the first or second terminal of the first resistor and a second terminal coupled to ground. At least the first resistor is a non-linear resistor whose resistance changes as a function of the voltage across the resistor. The monolithic attenuator and limiter circuit may be part of a "Pi" or "Tee" topology. According to another aspect, a non-linear shunt resistor coupled to the input of an amplifier circuit can operate to linearize the gain of the amplifier circuit over a range of input levels.

25 Claims, 15 Drawing Sheets

MONOLITHIC ATTENUATOR, LIMITER, AND LINEARIZER CIRCUITS USING NON-LINEAR RESISTORS

RELATED APPLICATIONS

The present application claims priority to U.S. Provisional Patent Application Ser. No. 62/351,361, filed Jun. 17, 2016, the disclosure of which is incorporated herein by reference in its entirety.

FIELD OF THE DISCLOSURE

The present disclosure relates to Radio Frequency (RF) monolithic attenuator, limiter, and linearizer circuitry.

BACKGROUND

Attenuators are circuits that attenuate (reduce) an input signal by a predefined amount or percentage. Limiters are circuits that are designed to limit input power to an amplifier or other device to prevent damage to the device. Limiters are used in a variety of applications, in particular for front end protection of receivers. Some limiters do not attenuate the input signal at all until a threshold limit is reached. Linearizers are circuits that compensate for some non-linear behavior of another circuit, such as an amplifier, to provide a linear response. All three types of circuits may be used in RF systems, including microwave systems.

Microwave attenuators often are useful in microwave systems for a variety of reasons. These include buffering poor return losses and reducing system gain levels. Simple resistive attenuators can be realized from well-known design equations. Examples are the "T-network ("Tee") and Pi-network ("Pi") attenuators.

FIG. 1A is a schematic 10 of conventional Tee and Pi attenuators. Limiting power $P_{OUT}$ is determined by the series resistor in the Tee case. In the Pi case, $P_{OUT}$ is primarily determined by the series resistor; however, there is a small amount of current that passes through the shunt resistor. The design equations for a T- and Pi-network resistive attenuators are well known. For a T-network they are, $$R_1 = Z_0 \frac{10^{dB/20} - 1}{10^{dB/20} + 1}, \quad (1)$$

$$R_2 = 2Z_0 \frac{10^{dB/20}}{10^{dB/10} - 1}, \quad (2)$$

where $R_1$ and $R_2$ are the series and shunt resistors respectively, $Z_0$ is typically 50Ω, and dB is the desired attenuation value in dB.

For minimum attenuation, $R_2 \to \infty$ while $R_1 \to 0$. The T-network attenuator has similar properties with the series resistor approaching 0Ω and the shunt resistors approaching infinity for small attenuations. Due to process limitations in the Qorvo 0.25 μm Gallium Nitride (GaN) process, the minimum dimension length of a resistor is 5 μm. This effectively puts a limit on the minimum attenuation that a GaN resistor network can have in order to limit at a particular power level. To explain more clearly, a limiter is desired to have a small insertion loss, especially at higher powers where additional tenths of dB in power may be very costly. To approach 0Ω for the series resistors, $R_1$, the implemented GaN resistor width must be very wide or the length must approach 0. However, making the resistor wider increases the saturation current thereby increasing the power the attenuator would limit at. The minimum attenuation value versus limiting power is derived in the following paragraphs. Again, the limiting power is defined as the maximum output power from the attenuator (assuming a 50 Ω system). The input power at that maximum output power will be larger than the output power plus the nominal attenuation. This is due to compression of the nonlinear resistors.

The peak current through a resistor is $$I_{pk} = I_{sat} w, \quad (3)$$

where w is the width of the resistor (perpendicular to current flow), and $I_{sat}$ for the process used is 1 A/mm. The resistance of a sheet resistor is given by $$R = \frac{l}{w} R_s, \quad (4)$$

where l is the length (parallel to current flow) of the resistor and $R_S$ is the resistance in Ω per square. The peak current through the resistor will determine the power that can be passed to the output of the attenuator.

$$I_{pk} = I_{sat} \frac{l}{R} R_s \quad (5)$$

For the T-network attenuator, the limiting resistor is the second series resistor assuming the physical size of the first series resistor is much larger so that there is no significant limiting effect. The limiting power is easily found as $$P_{out}^T = \frac{1}{2} I_{out}^2 Z_0 = \frac{1}{2} I_{pk}^2 Z_0 = \frac{Z_0}{2} \left( \frac{l R_s I_{sat}}{R_1} \right)^2. \quad (6)$$

where $Z_0$ is the system impedance. $R_1$ can be found by the design equations for the T-network resistive attenuator.

For the Pi-network, there is a small adjustment due to the current that passes through the shunt resistor. The output current is related to the current through the series resistor as $$I_{out} = \frac{R_1}{R_1 + Z_0} I_{R2} \quad (7)$$

and so the limiting power is $$P_{out}^{Pi} = \frac{Z_0}{2} \left( \frac{l R_s I_{sat}}{R_2} \right)^2 \left( \frac{R_1}{R_1 + Z_0} \right)^2. \quad (8)$$

A similar equation can found for the T-network if the first series resistor is the limiting component.

FIG. 1B is a graph illustrating the limiting power versus attenuation for T- and Pi-network resistive attenuators with the minimum length of l=5 μm and a saturation current of $I_{sat}$=1 A/mm. One may note that the Pi-network allows lower attenuation values for a given limiting power. Any point above the line (l=5 μm) is realizable in the GaN process used.

Microwave amplifiers typically have maximum input power ratings. These ratings are derived based on laboratory testing that determines the maximum amount of input power the amplifier can withstand prior to the onset of damage or permanent degradation. Users of the amplifier must be careful to not provide an input power greater than this recommended level. A well-known two-port microwave circuit is a power limiter. At non-limiting levels of input power, the output power of the limiter is very nearly the input power. However, as the level of input power rises beyond a critical threshold, the limiter begins to limit the amount of output power. The remaining power is either reflected back to the input port or dissipated within the circuit in some manner.

Microwave limiters are often realized in a technology that is not integrated in the same process as a Monolithic Microwave Integrated Circuit (MMIC) amplifier. For instance, limiters using PIN diodes—which have a wide, un-doped intrinsic semiconductor region between a p-type semiconductor and an n-type semiconductor—are not available for fabrication on currently available Gallium Arsenide (GaAs) or Gallium Nitride (GaN) MMIC processes. Additionally, many types of limiters require Direct Current (DC) bias (power) to provide limiting with very high levels of input power.

Thus, there is a need for attenuators, limiters, and linearizers that can be integrated with MMICs. By putting these circuits on the same die with each other parts counts are reduced, interconnect costs and problems are reduced, reliability is improved, process mismatch problems are eliminated, and economies of scale may be achieved.

SUMMARY

The present disclosure relates to a monolithic limiter, attenuator, and linearizer circuitry to be integrated with other circuitry on chip. The circuits are enabled by the use of the non-linear, current-limiting characteristic of Gallium Arsenide (GaAs; mesa) resistors and Gallium Nitride (GaN) epitaxial resistors, for example. As defined herein, a non-linear resistor is a resistor whose resistance changes as a function of the voltage across the resistor. As defined herein, a linear resistor is a resistor whose resistance is essentially constant regardless of the voltage across the resistor.

According to one aspect of the present disclosure, a monolithic attenuator and limiter circuit comprises an input terminal, an output terminal, a first resistor having a first terminal coupled to the input terminal and a second terminal coupled to the output terminal, and a second resistor having a first terminal coupled to the first or second terminal of the first resistor and a second terminal coupled to ground. At least the first resistor is a non-linear resistor.

In one embodiment, the second resistor comprises a linear resistor.

In one embodiment, the second resistor comprises a non-linear resistor.

In one embodiment, the second resistor is coupled between the first terminal of the first resistor and ground and the circuit further comprises a third resistor coupled between the second terminal of the first resistor and ground.

In one embodiment, the second resistor comprises a linear resistor. In one embodiment, the third resistor comprises a linear resistor. In one embodiment, the third resistor comprises a non-linear resistor.

In one embodiment, the second resistor comprises a non-linear resistor. In one embodiment, the third resistor comprises a linear resistor. In one embodiment, the third resistor comprises a non-linear resistor.

In one embodiment, the first resistor and a third resistor are connected in series between the input terminal and the output terminal and the second resistor is coupled to the terminal of the first resistor that is connected directly to the third resistor.

In one embodiment, the second resistor comprises a linear resistor. In one embodiment, the third resistor comprises a linear resistor. In one embodiment, the third resistor comprises a non-linear resistor.

In one embodiment, the second resistor comprises a non-linear resistor. In one embodiment, the third resistor comprises a linear resistor. In one embodiment, the third resistor comprises a non-linear resistor.

In one embodiment, the monolithic attenuator and limiter circuit further comprises an amplifier circuit having an amplifier output and having an amplifier input connected to the output terminal of the monolithic attenuator and limiter circuit.

In one embodiment, the amplifier circuit comprises a Radio Frequency (RF) amplifier.

In one embodiment, the amplifier circuit comprises a microwave frequency amplifier.

In one embodiment, the amplifier circuit is constructed using the same process as the monolithic attenuator and limiter circuit.

In one embodiment, the amplifier circuit and the monolithic attenuator and limiter circuit are fabricated on the same wafer die.

According to another aspect of the present disclosure, a linearizer circuit comprises an input terminal, an output terminal coupled to the input terminal, and a non-linear resistor having a first terminal coupled to the input terminal and a second terminal coupled to ground.

According to yet another aspect of the present disclosure, a linearized amplifier comprises an input terminal, an output terminal, an amplifier circuit having an input coupled to the input terminal and an output coupled to the output terminal, and a non-linear resistor having a first terminal coupled to the input terminal and a second terminal coupled to ground.

In one embodiment, the non-linear resistor linearizes the linearized amplifier by providing an input-voltage-dependent gain adjustment.

Those skilled in the art will appreciate the scope of the present disclosure and realize additional aspects thereof after reading the following detailed description in association with the accompanying drawings.

BRIEF DESCRIPTION OF THE DRAWINGS

The accompanying drawing figures incorporated in and forming a part of this specification illustrate several aspects of the disclosure and, together with the description, serve to explain the principles of the disclosure.

DETAILED DESCRIPTION

The present disclosure relates to a circuit that serves as both an attenuator and a limiter, and which, in some configurations, may operate as a linearizer. The applications and features of the present disclosure include but are not limited to the following:

Limit input power to an amplifier (or other device) to prevent damage to the device;

Behave as a standard attenuator at small signal;

Potential use as a linearizer to compensate for Amplitude-to-Amplitude Modulation (AM/AM) distortion; and Easily integrated on the Gallium Arsenide (GaAs) and Gallium Nitride (GaN) Monolithic Microwave Integrated Circuit (MMIC) processes and therefore not requiring a separate chip (monolithic integration).

At high input powers, nonlinearity of the GaAs and GaN resistors causes a limiting effect. The nonlinear resistors are implemented as a T- or Pi-network resistive attenuator to provide a wide band and high-power limiter with a very small footprint. Often microwave attenuators are useful in microwave systems for a variety of reasons. These include buffering poor return losses and reducing system gain levels. In addition, GaAs and GaN resistors can easily be integrated with a MMIC power amplifier or front-end-module. Limiting powers from 0.4 W up to 10 W (defined as the maximum output power from the attenuator) with various attenuations have been demonstrated using Qorvo's GaN 0.25 µm process. Finally, the limiters are shown to have no spike leakage as they are resistive in nature.

Figure 2:
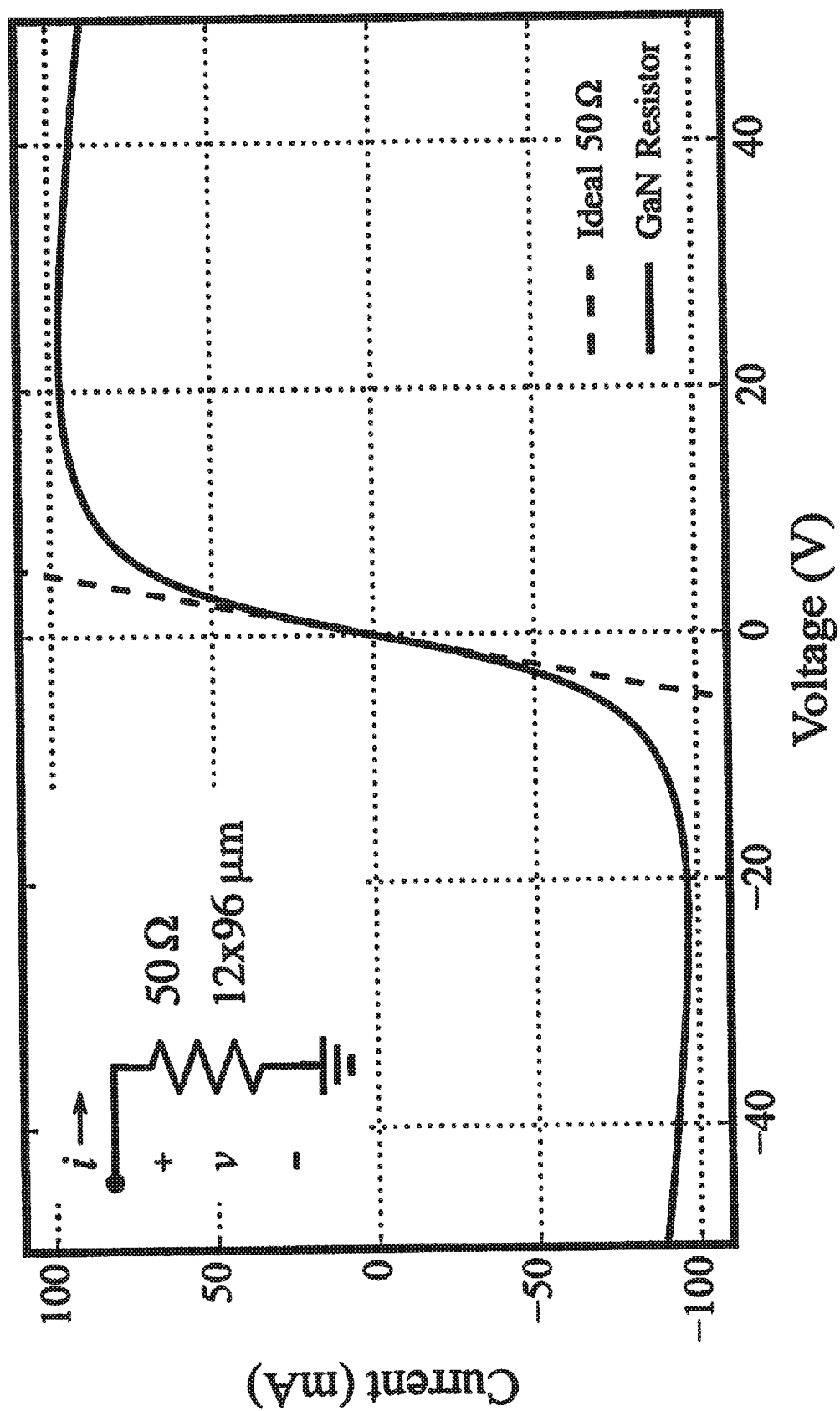
FIG. 2 is a graph showing current through a shunt Gallium Nitride (GaN) non-linear resistor according to an embodiment of the present disclosure.

FIG. 2 is a graph showing current through a shunt GaN non-linear resistor according to an embodiment of the present disclosure. Using GaN for example, DC-IV measurements of a GaN resistor were taken. In FIG. 2, a typical curve of a 50 Ω (12×96 µm) GaN resistor is shown as a solid line as compared to an ideal 50 Ω resistor, shown as a dashed line. The resistance of the GaN resistor is highly nonlinear and saturates at approximately 97 mA. The width is 96 µm, giving an $I_{max}$ of 1 A/mm, which is also typical of a saturated FET in the process. The decrease in $I_{max}$ beyond 24 V applied to the resistor is most likely due to thermal heating of the resistor; while the current is limited, the power dissipation still increases because of the increasing voltage.

Figure 3A:
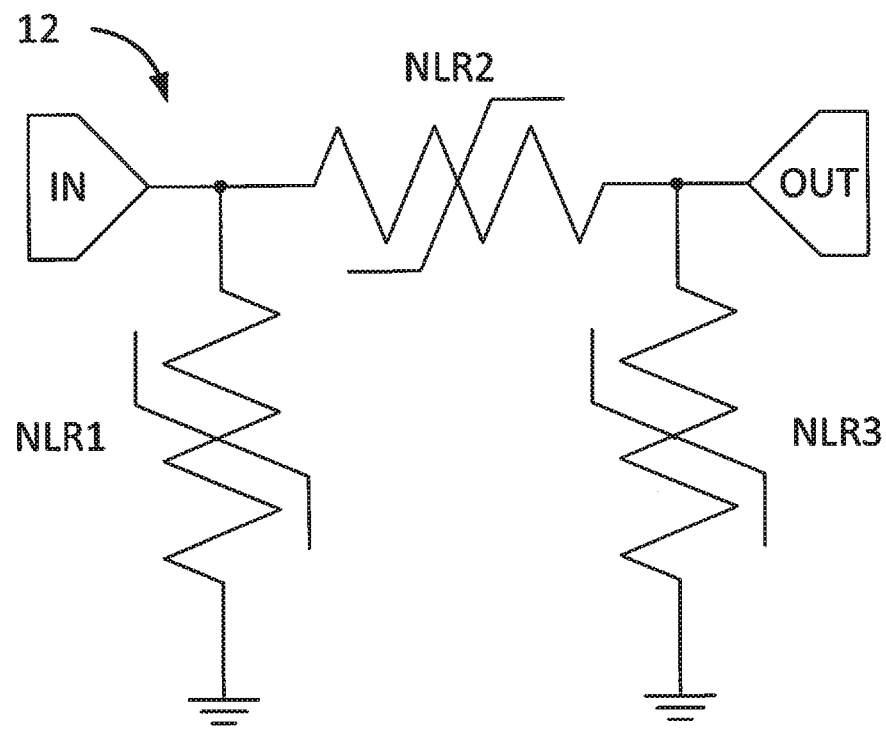
FIGS. 3A and 3B are schematics showing an exemplary Pi attenuator using non-linear resistors according to embodiments of the present disclosure.

FIG. 3A is a schematic showing an exemplary Pi attenuator 12 using non-linear resistors according to an embodiment of the present disclosure. In the embodiment illustrated in FIG. 3A, the attenuator 12 has an input terminal IN, an output terminal OUT, and non-linear resistors NLR1, NLR2, and NLR3 in a Pi topology. The values of the non-linear resistors NLR1, NLR2, and NLR3 are dictated by the well-known design equations for attenuators in a Pi topology using standard (i.e., not non-linear) resistors. These equations allow the designer to define the desired level of attenuation. Solving these equations produces values for the resistors that, when used, achieve the desired attenuation, e.g., that provides proper impedance matching at input terminal IN and output terminal OUT and that enforces zero reflection on both the input terminal and output power. All the attenuated power may dissipate within the attenuator.

In some GaAs and GaN processes, non-linear resistors using Field-Effect Transistors (FETs) may be fabricated. Additionally, an easier way to create them is using GaAs, or mesa, resistors. These resistors have the unique property that they can only pass a certain amount of current before saturating. Once the saturation current is reached, the resistance increases because the voltage increases while the current stays the same.

Moreover, it is not necessary that every resistor in the Pi topology, for example, be a non-linear resistor: the circuit in FIG. 3A will operate both as attenuator and limiter with just the series resistor (e.g., NLR2) being a non-linear resistor. The shunt resistors R1 and R3 may be normal resistors or non-linear resistors. This allows the design of a combination attenuator and limiter in processes which have only non-linear resistors and in processes which have both linear and non-linear resistors. An example of such an alternative embodiment is shown in FIG. 3B.

Figure 3B:
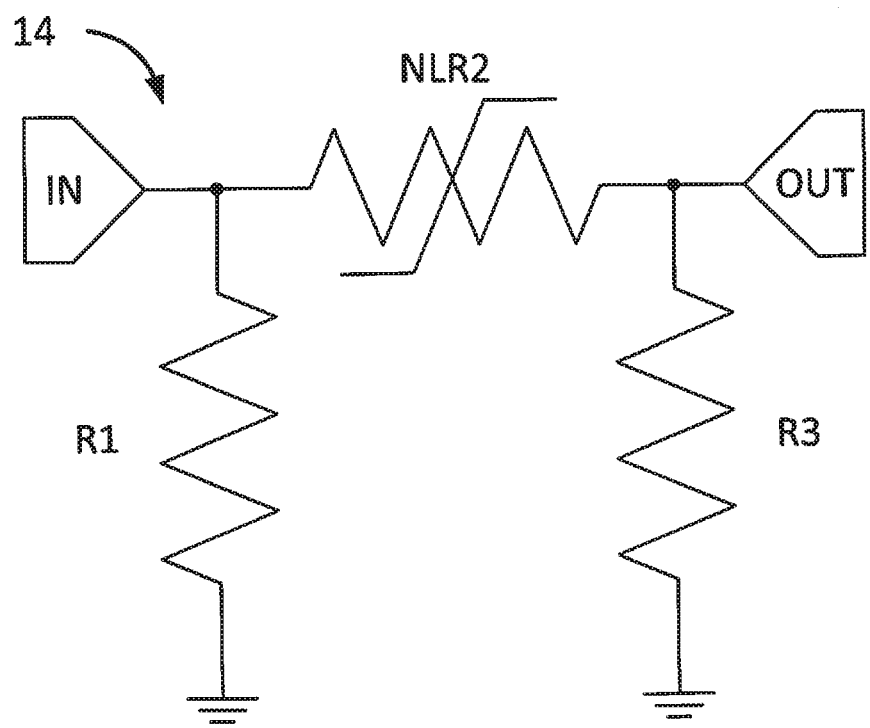

FIG. 3B is a schematic showing an exemplary Pi attenuator 14 according to another embodiment of the present disclosure. In the embodiment illustrated in FIG. 3B, the attenuator 14 uses a non-linear resistor NLR2 and normal resistors R1 and R3. The values of the resistors R1, NLR2, and R3 are dictated by the well-known design equations for attenuators in a Pi topology. FIG. 3B illustrates the point that it is not necessary that all resistors in the Pi attenuator be non-linear in order for the circuit to perform as a limiter in addition to an attenuator: as long as one series resistor is a non-linear resistor the circuit will act as a limiter.

Figure 1A:
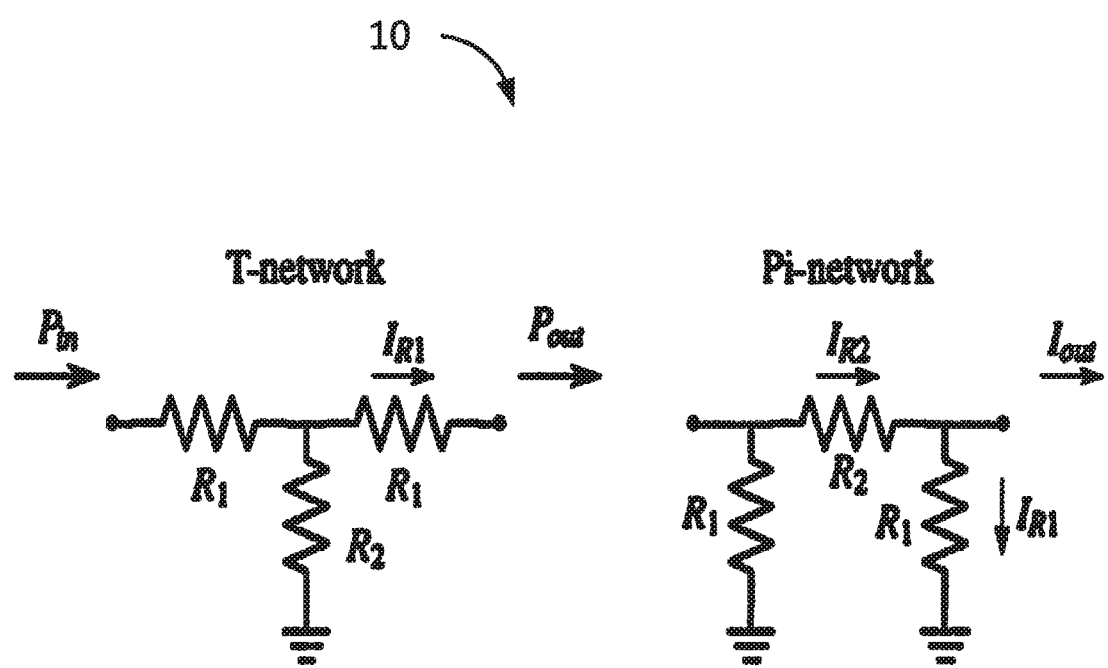
FIG. 1A is a schematic showing standard Tee and Pi attenuators.
Figure 1B:
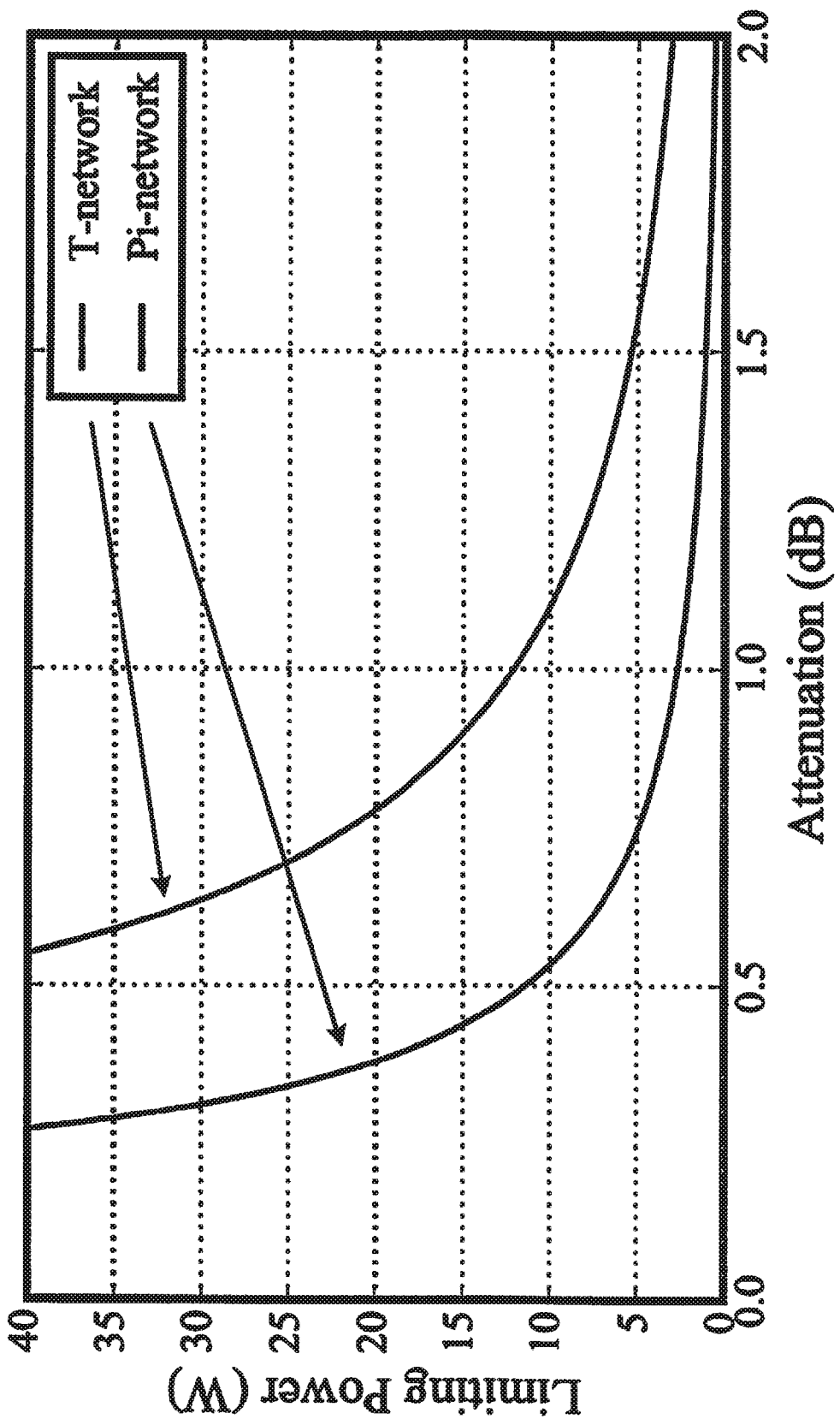
FIG. 1B is a graph showing limiting power versus attenuation for Tee and Pi networks.

In the small signal operating regime, the circuits in FIG. 1, FIG. 3A, and FIG. 3B show the same behavior, assuming the resistor values are identical (i.e., the resistance of R1=the resistance or NLR1, R2=NLR2, and R3=NLR3). However, in the large signal regime, the behaviors of the circuits in FIGS. 3A and 3B diverge from the behavior of the circuit in FIG. 1. A "large signal" is defined as a signal at which any of the non-linear resistors in the circuit begin to behave in a nonlinear fashion. This behavior is shown in FIG. 4.

Figure 4:
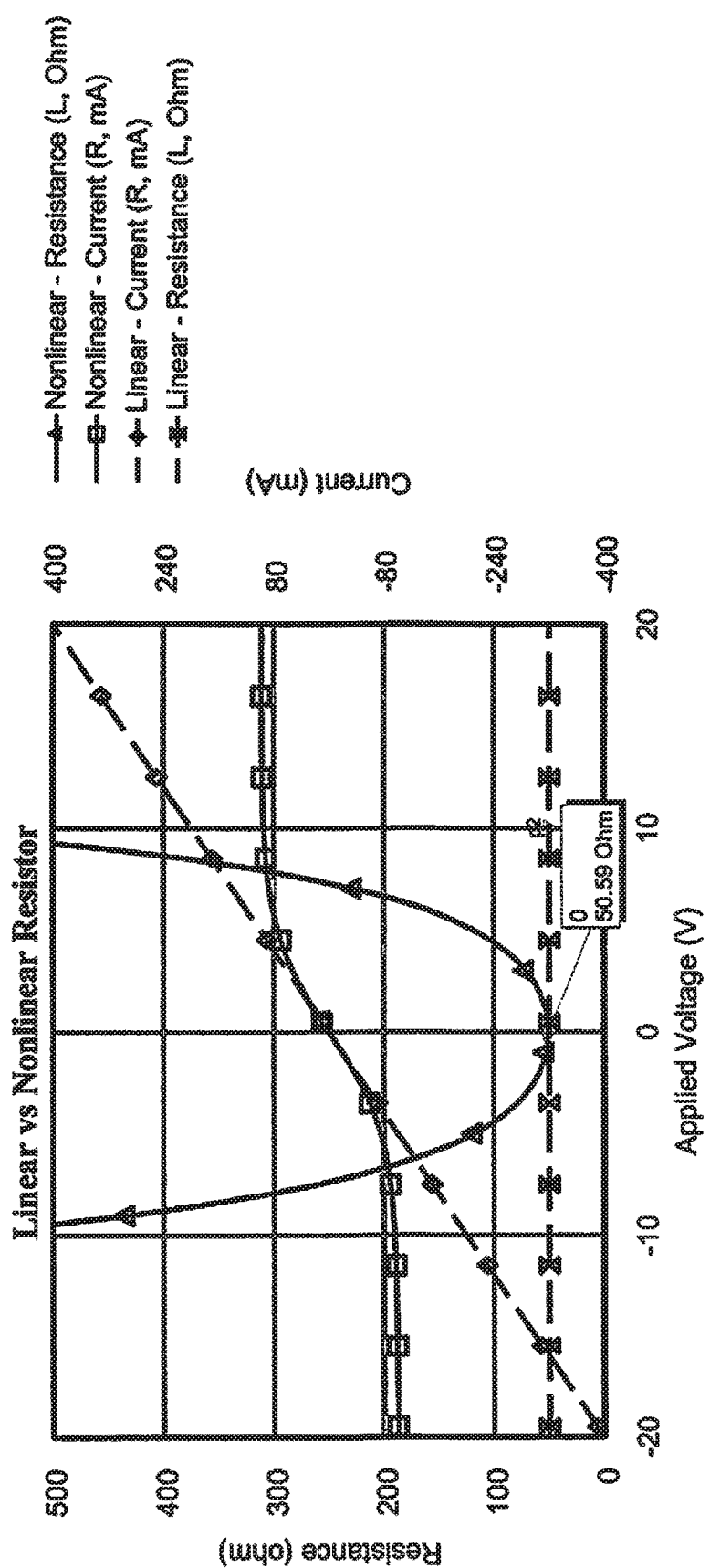
FIG. 4 is a graph showing current and resistance versus applied voltage (Direct Current (DC)) for an exemplary linear resistor and nonlinear resistor according to an embodiment of the present disclosure.

FIG. 4 is a graph showing current and resistance versus applied voltage (Direct Current (DC)) for an exemplary linear resistor and nonlinear FET device according to an embodiment of the present disclosure. The X-axis shows the applied voltage across the resistor. The current through the resistor, and the effective resistance of the resistor, are plotted in the Y-axis. Referring to FIG. 4, it can be seen that the current through a linear resistor (dashed line, diamond data points) is a linear function of the applied voltage, which results in a constant resistance (dashed line, hourglass data points). In contrast, the current through a non-linear resistor (solid line, box data points) is limited to about 100 mA for a positive applied voltage and about −100 mA for a negative applied voltage, which results in a non-linear resistance (solid line, triangle data points). The current saturation and resistance increase is shown in FIG. 4 for a FET model in common gate configuration.

The magnitude of the saturation current (i.e., |100 mA| in the plot illustrated in FIG. 4) is dependent upon the topology of the resistor itself, i.e., it may be tuned by adjusting the width of the non-linear resistor, while the value of the non-linear resistor may be controlled by the ratio of width to length of the resistor in view of the process design rules. Using these two sets of equations, it is possible to design an attenuator that also operates as a limiter, where both the attenuation and the saturation current may be independently specified.

Figure 5:
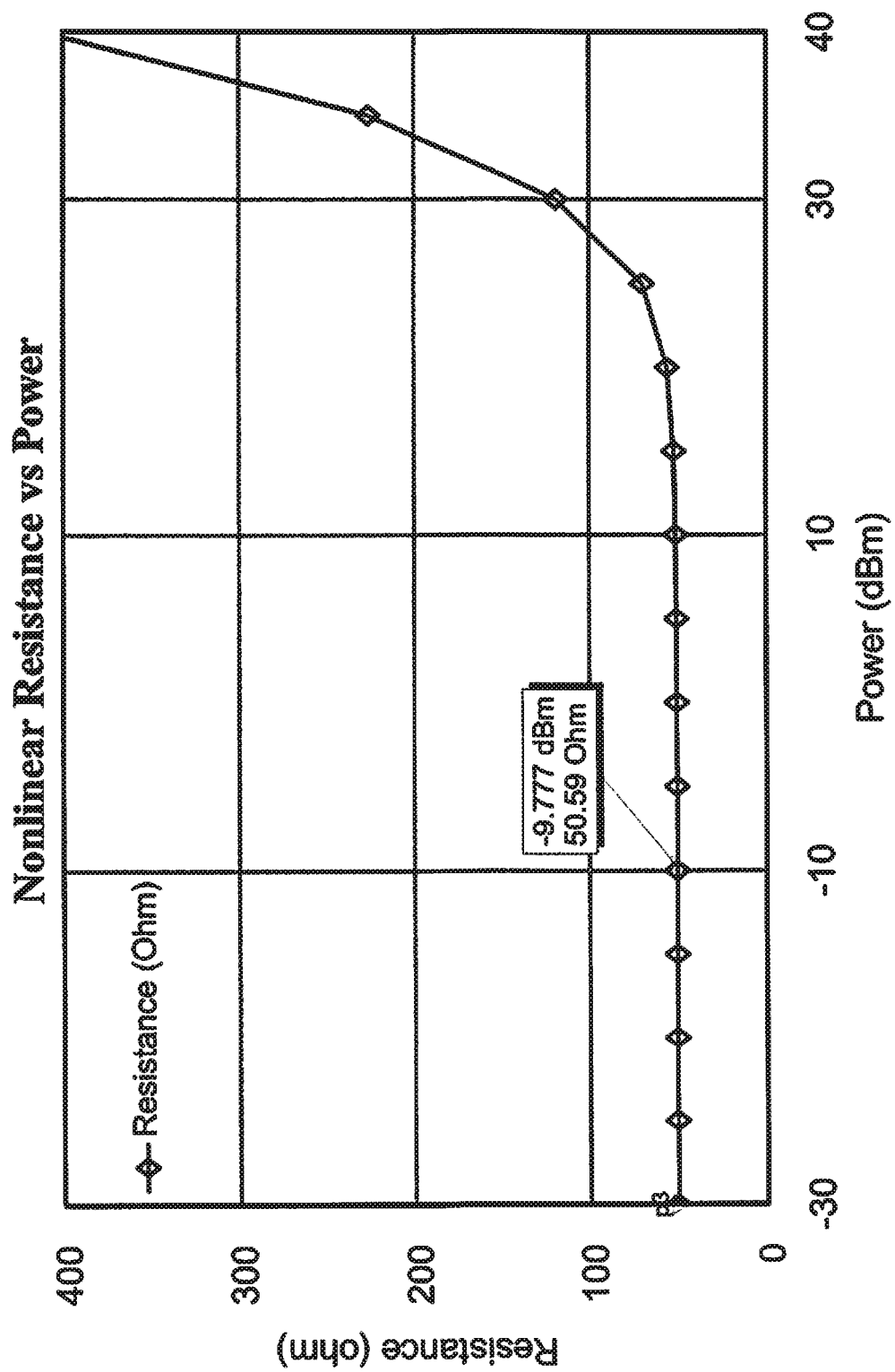
FIG. 5 is a graph showing the resistance versus input power to the resistor.

FIG. 5 is a graph showing the resistance of the FET versus power, and illustrates the point that the same current saturation happens with increasing power at any particular frequency. This type of behavior may be used to great benefit by an attenuator such as the one illustrated in FIG. 2. For example, as the input power to the attenuator increases, the current through the resistors increases. At some level of input power, the current through the resistors hits the saturation current. Both the shunt and series resistors go to a high impedance state. Given that the series resistor cannot pass additional current to the output port, the power is limited nicely. Therefore, the attenuator in FIG. 2 behaves as a limiter in the large signal regime. As stated above, the input power level defining the large signal regime may be easily tailored by the width of the resistors, since the width of the resistors dictates the saturation current. The limiting behavior of the attenuator is mainly reflective, although there is still some power dissipated in the resistors.

The method of the present disclosure is described in terms of a Pi attenuator topology, such as shown in FIG. 2, but it equally applies to any attenuator having resistors, including, but not limited to, a Tee attenuator or bridged-Tee attenuator, for example. The limiter behavior aspect extends equally well to any other topology of attenuator having a series resistor. Another example of this is shown in FIG. 5, which shows an embodiment as used within a power amplifier.

Figure 6:
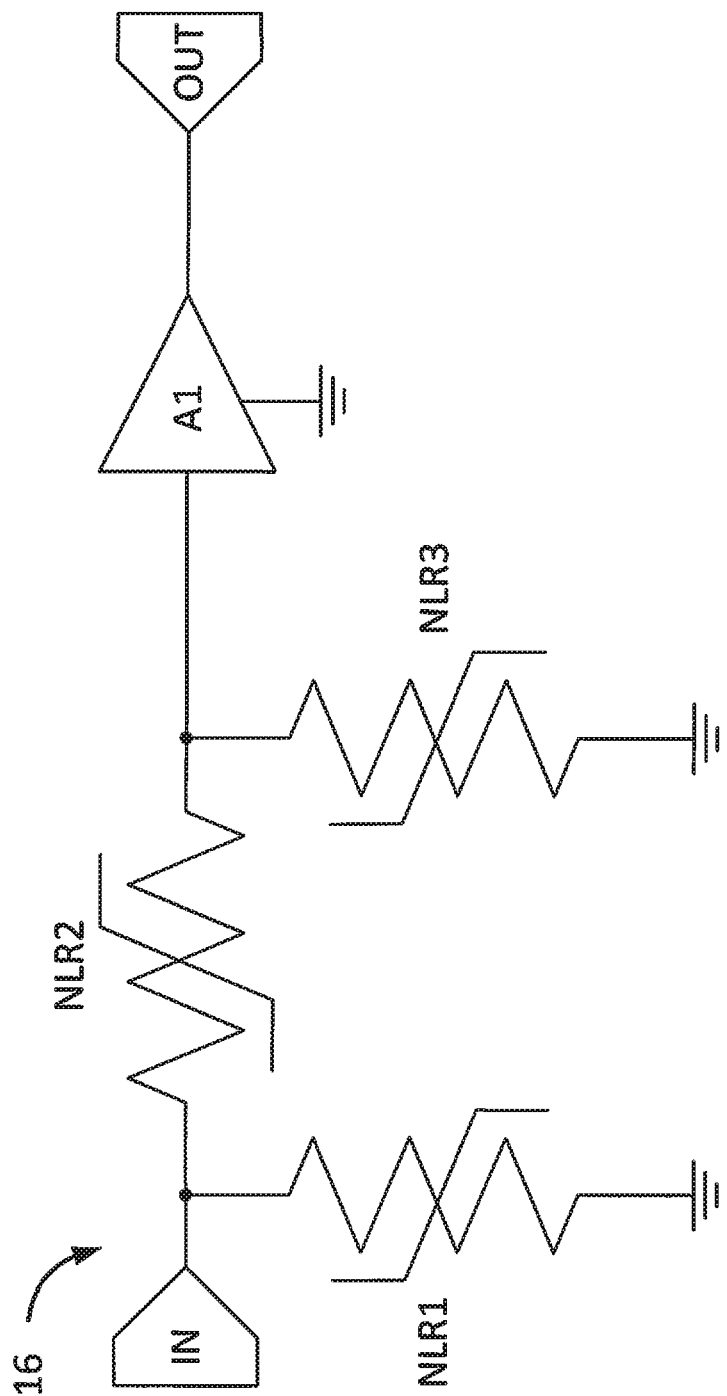
FIG. 6 is a schematic showing an exemplary limiting attenuator-on-amplifier input example according to an embodiment of the present disclosure.

FIG. 6 is a schematic showing an exemplary limiting attenuator-on-amplifier 16 input example according to an embodiment of the present disclosure. In the embodiment illustrated in FIG. 6, the power amplifier 16 includes a combination attenuator/limiter comprised of NLR1, NLR2, and NLR3 in a Pi configuration, the output of which is connected to the input of a power amplifier A1. The signal at input terminal IN is attenuated and limited before being provided to the input of A1. The output of A1 is connected to output terminal OUT. As with the attenuator and limiter shown in FIG. 3, it is not necessary that all resistors in the Pi topology be non-linear resistors. In an alternative embodiment, shunt resistors NLR1 and NLR3 may be replaced with normal resistors R1 and R3.

The combination attenuator/limiter illustrated in FIG. 6 may be manufactured using the same process, and perhaps on the same die as, the amplifier A1. By putting these circuits on the same die with each other parts counts are reduced, interconnect costs and problems are reduced, reliability is improved, process mismatch problems are eliminated, and economies of scale may be achieved.

Figure 7:
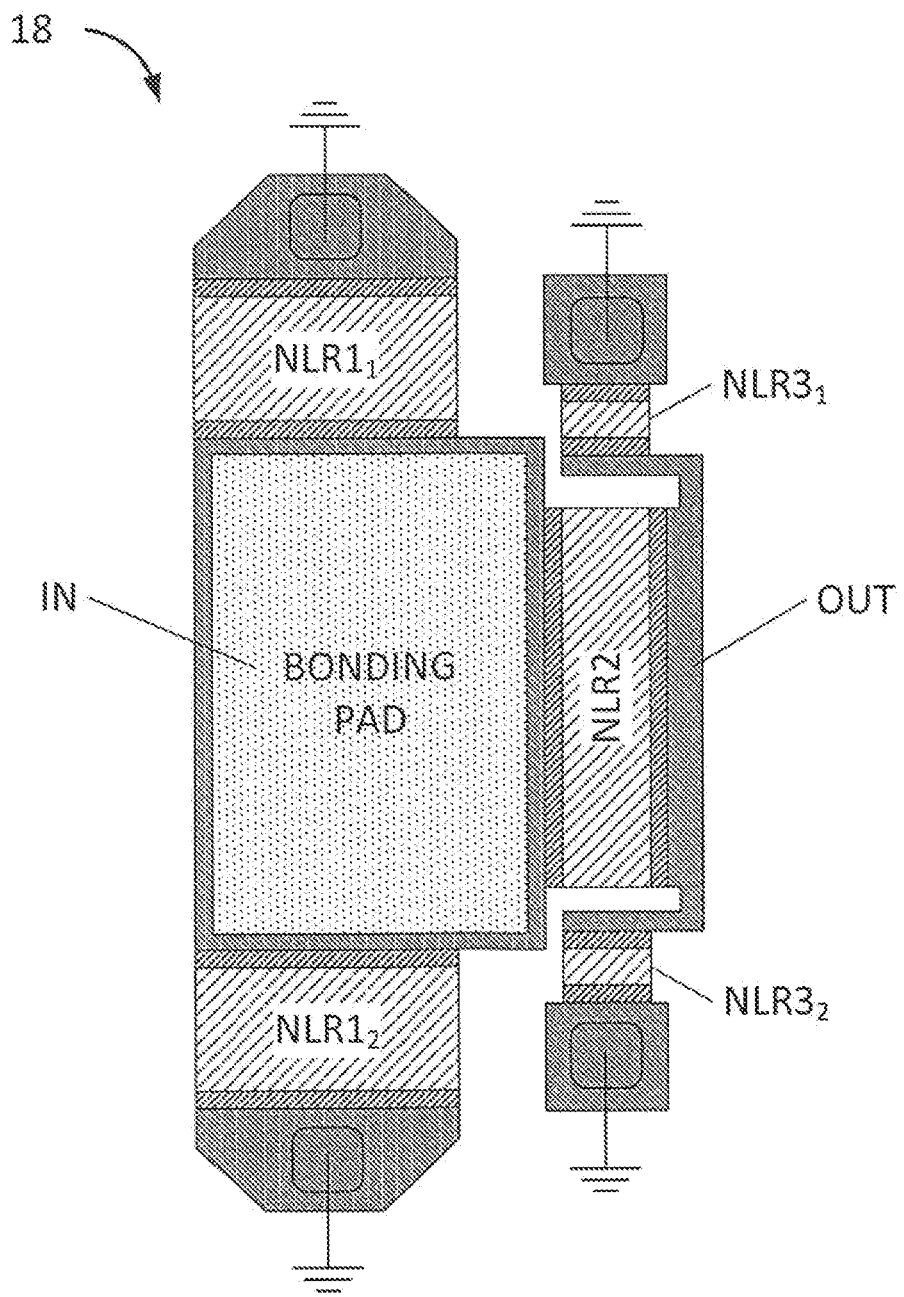
FIG. 7 shows an exemplary layout of a Pi network attenuator/limiter on the input pad of an amplifier according to an embodiment of the present disclosure.

FIG. 7 shows an exemplary layout of a Pi network attenuator/limiter 18 according to an embodiment of the present disclosure. In one embodiment, the attenuator/limiter 18 may be on the input pad of an amplifier or other device which may benefit from having a monolithic attenuator and limiter. In the embodiment illustrated in FIG. 7, the input terminal IN is a bonding pad that is electrically connected to ground via two non-linear resistors $NLR1_1$ and $NRL1_2$, which together are equivalent to NRL1 in FIG. 2, for example. (Since $NLR1_1$ and $NLR1_2$ are connected in parallel, the value of each of $NLR1_1$ and $NRL1_2$ would be two times the desired value of NLR1 in FIG. 2.) The bonding pad is connected to one end of a second non-linear resistor, NLR2. The other end of NLR2 is connected to a pair of non-linear resistors, $NLR3_1$ and $NLR3_2$, which are connected in parallel to ground. The other end of NLR2 is also the output terminal OUT. In an example embodiment, the attenuator/limiter 18 illustrated in FIG. 7 may be placed on an input RF pad as a 10 dB attenuator. As stated above, both the attenuation and limiting characteristics may be controlled simply by adjusting the widths and lengths of the non-linear resistors.

Figure 8:
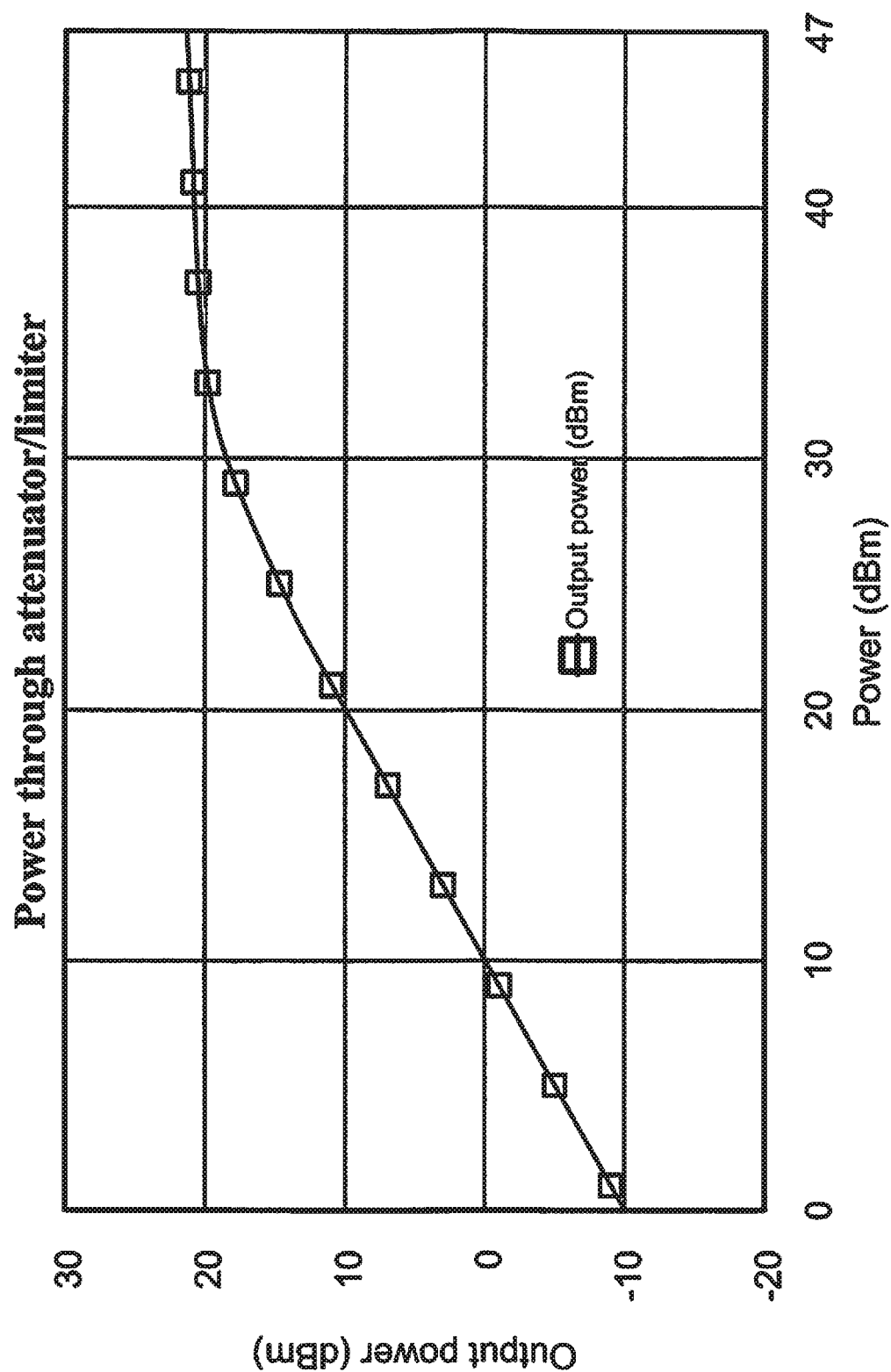
FIG. 8 is a graph showing the performance of the circuit in FIG. 6, in which the power through the circuit is clipped at approximately 21 dBm.

FIG. 8 shows the performance of the circuit using a simplified FET model that current saturates depending on the width of the mesa resistor. The power through the circuit behaves as a normal attenuator below the current saturation point and limits the output power to a maximum of approximately 21 dBm after the saturation point. For this Pi attenuator, the resistor values are R1=R3=96 Ω and R2=71Ω.

The concepts and principles described herein are not limited to attenuation circuits. The current limiting behavior of the resistor may also be used nicely as an AM/AM distortion compensator. One example application is shown in FIG. 9.

Figure 9:
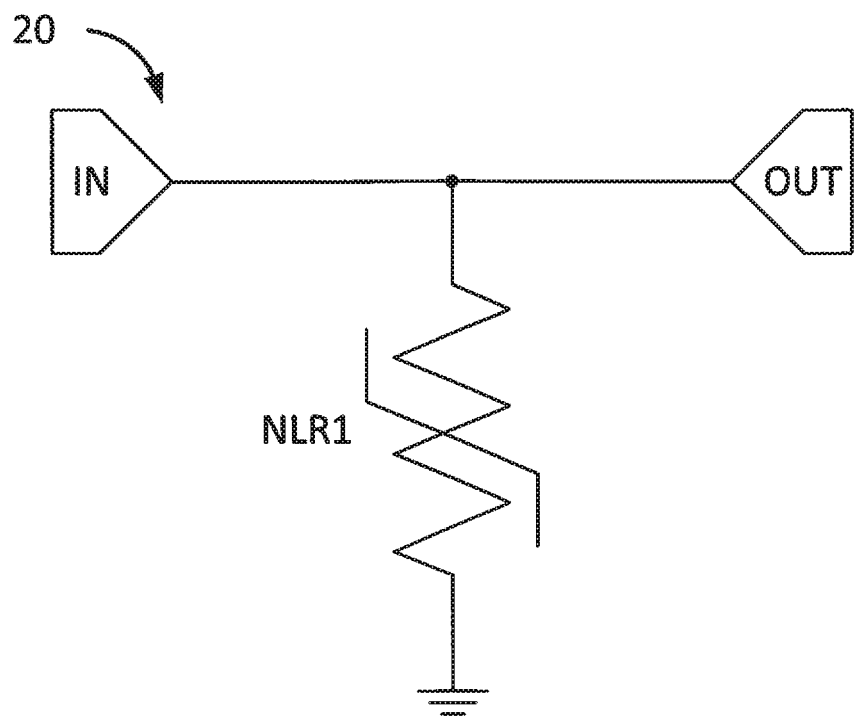
FIG. 9 is a schematic showing an exemplary shunt linearizing element according to an embodiment of the present disclosure.

FIG. 9 is a schematic showing an exemplary shunt linearizing element 20 according to an embodiment of the present disclosure. As previously described, at small signal levels, the resistor NLR1 in FIG. 9 behaves as a simple shunt resistor that has some level of attenuation based on the size of the resistance and the manner of use within the circuit. At a certain input power level dictated by the voltage across the resistor and width of the resistor, the current is limited and the impedance begins to increase. In this case, the attenuation begins to reduce since the impedance is increasing. As a limiting case, the resistance gets so large that it appears to the circuit that it is not even there. This type of behavior basically reduces gain at a small signal more than the gain is reduced at large signal, hence compensating for slow compression types of AM/AM distortion.

Figure 10:
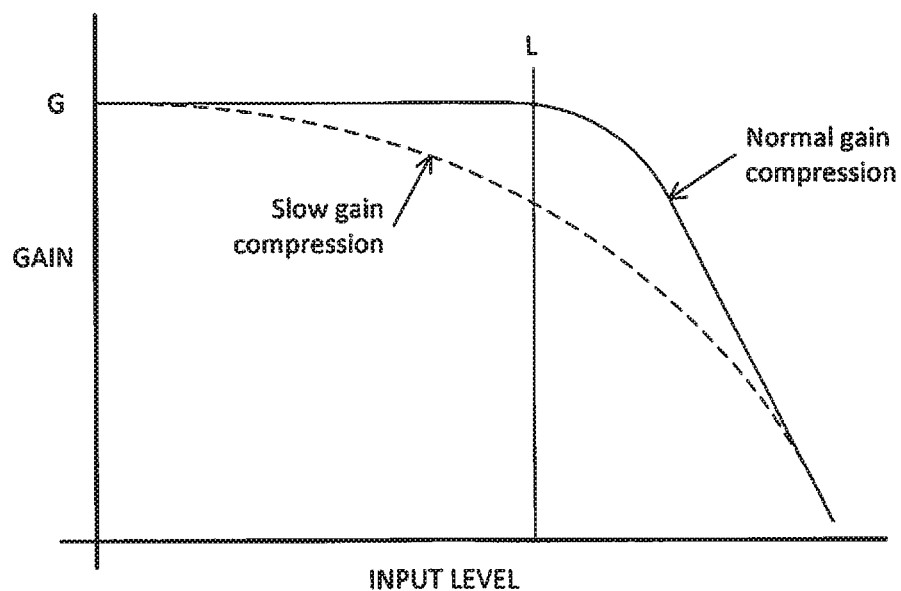
FIG. 10 is a graph contrasting the performance of an amplifier having normal gain compression versus an amplifier with slow gain compression.

FIG. 10 is a graph contrasting the performance of an amplifier having normal gain compression versus an amplifier with slow gain compression. For normal gain compression amplifiers, the gain of the amplifier remains at a fairly constant level "G" until the input levels approach some value "L," at which point the amplifier gain begins to drop. This is shown in FIG. 10 as the solid line. In contrast, the gain of a slow gain compression amplifier looks more like the dotted line in FIG. 10, i.e., the gain continually drops as the input level increases. Thus, the circuit 20 shown in FIG. 9 may be used to linearize the performance of such a slow gain compression amplifier. An example implementation is shown in FIG. 11.

Figure 11:
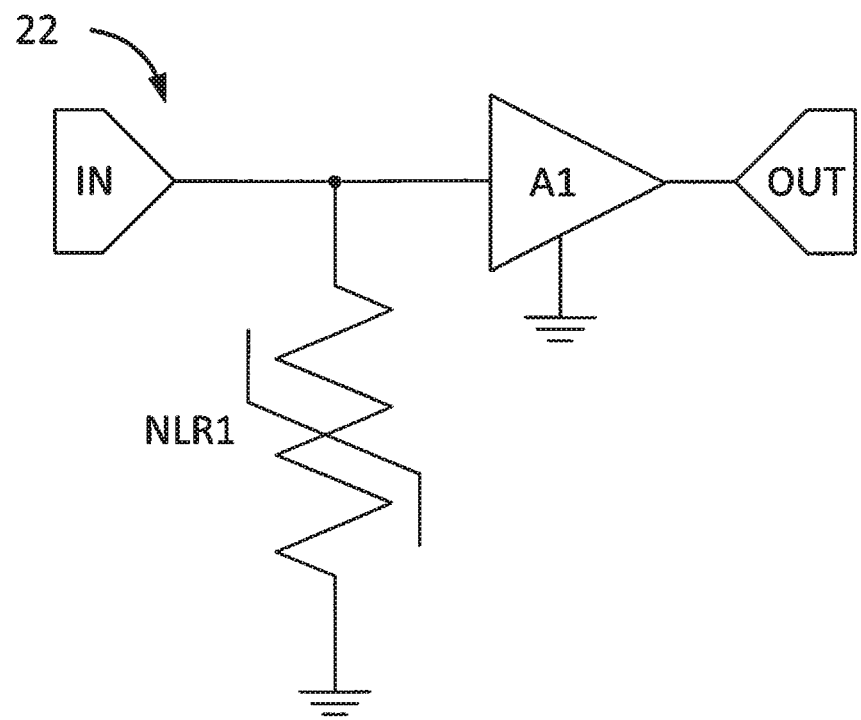
FIG. 11 is a schematic showing an exemplary shunt linearizer on a power amplifier front-end according to an embodiment of the present disclosure.

FIG. 11 is a schematic showing an exemplary shunt linearizer on a power amplifier front-end according to an embodiment of the present disclosure. In the embodiment illustrated in FIG. 11, circuit 22 includes an amplifier A1 having an input terminal IN and an output terminal OUT. A non-linear resistor NLR1 connects the amplifier input to ground. It should be noted that a linearizing shunt resistor could be used for each stage within a multi-stage amplifier, or only some or one of the stages depending on the non-linearity. As in the circuit 20 shown in FIG. 9, the non-linear resistor NLR1 presents as an impedance to ground for small input signals, but as the input signal levels increase the impedance of NLR1 increases. In this manner, NLR1 reduces the gain of the amplifier A1 at low signal levels but does not limit the gain at high signal levels. This is illustrated in FIG. 12.

Figure 12:
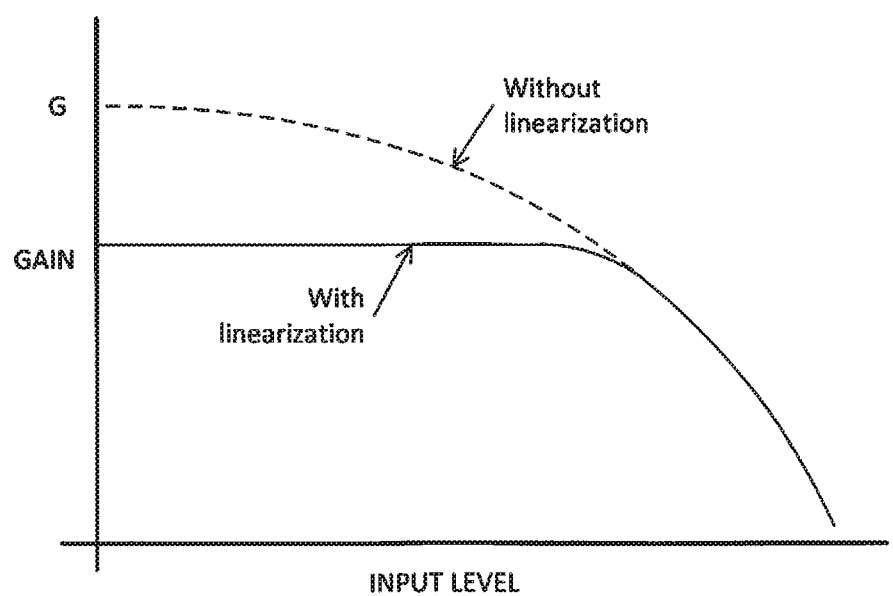
FIG. 12 is a graph contrasting the performance of a slow gain compression amplifier without linearization versus the same amplifier with linearization according to an embodiment of the present disclosure.

FIG. 12 is a graph contrasting the performance of a slow gain compression amplifier without linearization (dotted line) versus the same amplifier with linearization (solid line) according to an embodiment of the present disclosure. In one embodiment, the loss in gain caused by the linearization may be compensated by upward adjustment of the gain of that stage or by following that linearized stage with another amplification stage, or other techniques.

A specific advantage of this technique is as used in some GaN processes. The small signal gain of an amplifier fabricated using these processes typically has a large part-to-part variation at low current density. The variation at high current density is significantly less, so it is nice from a part variation standpoint to bias at a higher current density. However, the gain compression is significantly worse at higher current density than it is at lower current density. Using this linearizing technique, the designer should be able to bias at a high current density while eliminating most of the additional gain compression typically experienced from biasing at a high current density and therefore improving the AM/AM distortion.

Figure 13:
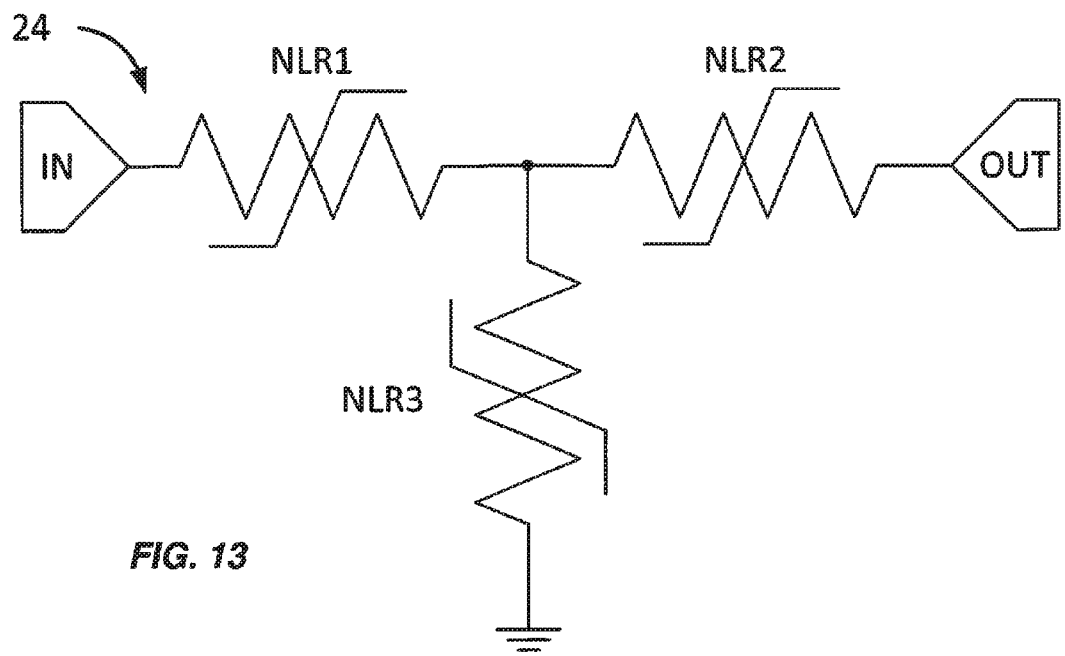
FIG. 13 is a schematic showing an exemplary Tee attenuator using non-linear resistors according to an embodiment of the present disclosure.

FIG. 13 is a schematic showing an exemplary Tee attenuator and limiter 24 using non-linear resistors according to an embodiment of the present disclosure. In the embodiment illustrated in FIG. 13, the attenuator and limiter 24 has an input terminal IN, an output terminal OUT, and non-linear resistors NLR1, NLR2, and NLR3 arranged in a Tee configuration, i.e., NLR1 and NLR2 connected in series between IN and OUT, with NLR3 connected as a shunt from the node between NLR1 and NLR2 to ground.

Figure 14:
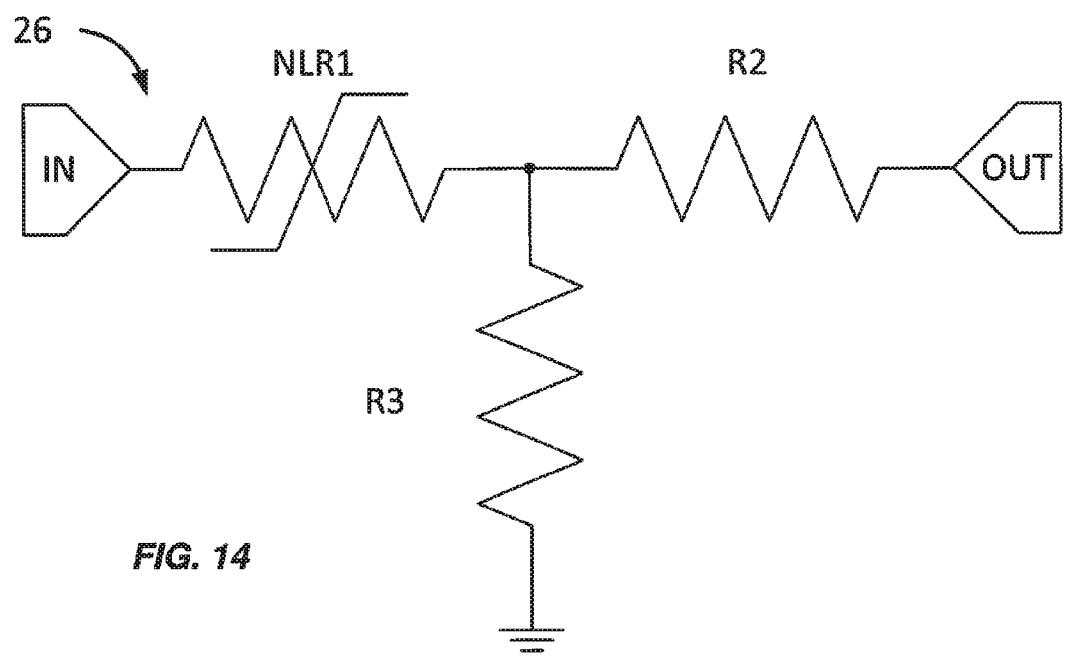
FIG. 14 is a schematic showing an exemplary Tee attenuator using both non-linear resistors and linear resistors according to another embodiment of the present disclosure.

FIG. 14 is a schematic showing an exemplary Tee attenuator and limiter 26 using both non-linear resistors and linear resistors according to another embodiment of the present disclosure. In the embodiment illustrated in FIG. 14, the attenuator and limiter 26 is similar to the attenuator and limiter 24 illustrated in FIG. 13, except that only one of the series-connected resistors (NLR1, in FIG. 14) need be a non-linear resistor while the other resistors in the Tee (R2 and R3, in FIG. 14) are normal resistors. In an alternative embodiment, the resistor directly connected to the IN terminal could be a normal resistor while the resistor directly connected to the OUT terminal could be the non-linear resistor. In an alternative embodiment, one of the series-connected resistors and also the shunt resistor are non-linear resistors. In yet another embodiment, both of the series resistors could be non-linear resistors while the shunt resistor could be a normal resistor.

Figure 15:
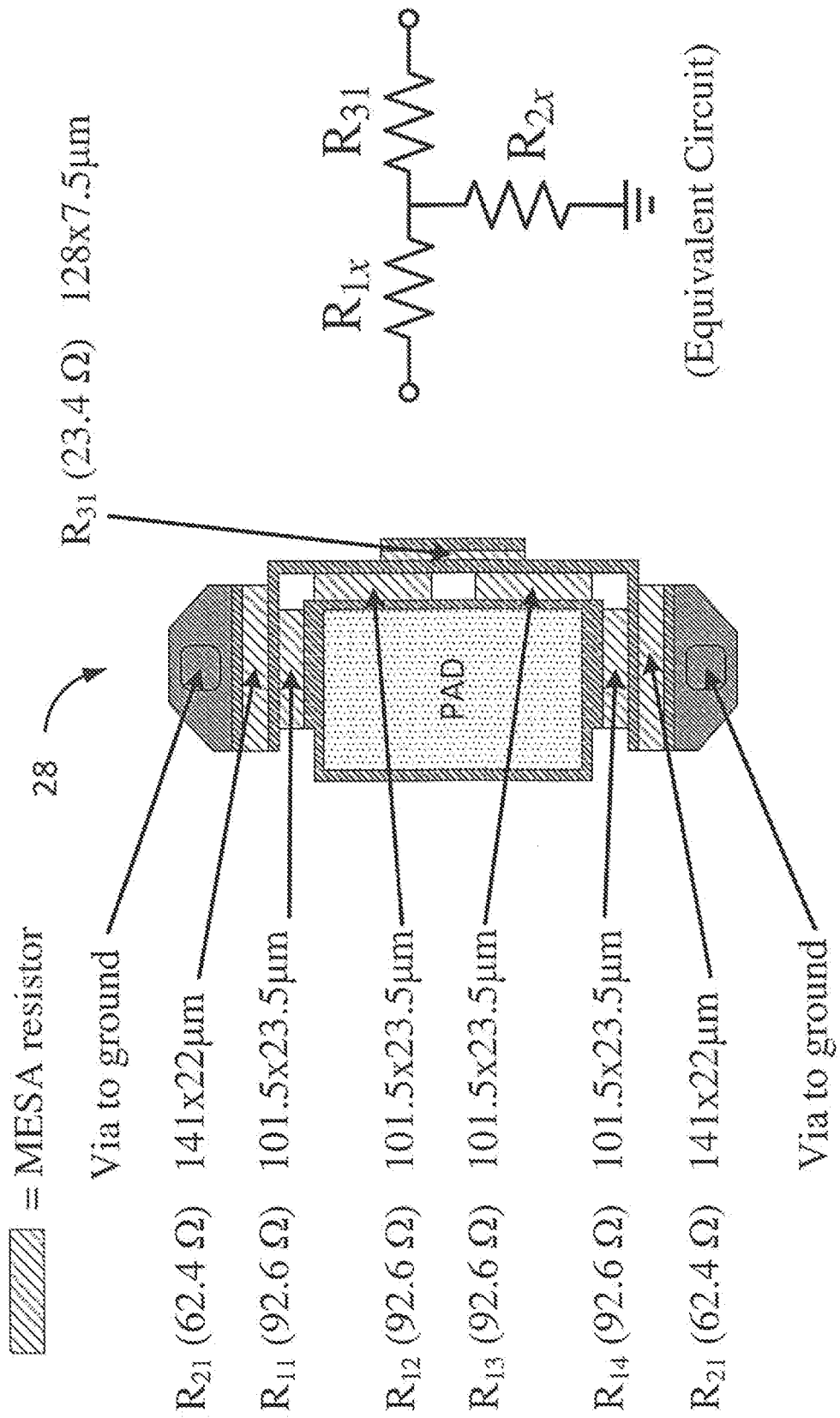
FIG. 15 shows an exemplary layout of a Tee network attenuator/limiter on the input pad of an amplifier according to an embodiment of the present disclosure.

FIG. 15 shows an exemplary layout of a 10 dB Tee network attenuator/limiter 28 (hereinafter referred to as "the attenuator 28") according to an embodiment of the present disclosure. The attenuator 28 is designed to limit at 26 dB of maximum output power. The first series resistor $R_{1x}$ was split into 4 distinct resistors in parallel and the shunt resistor $R_{2x}$ was split into two parallel elements to provide layout symmetry. The size of the layout shown is 202×497 µm. The largest part of the layout is the RF input pad where two bond wires would be located.

Figure 16:
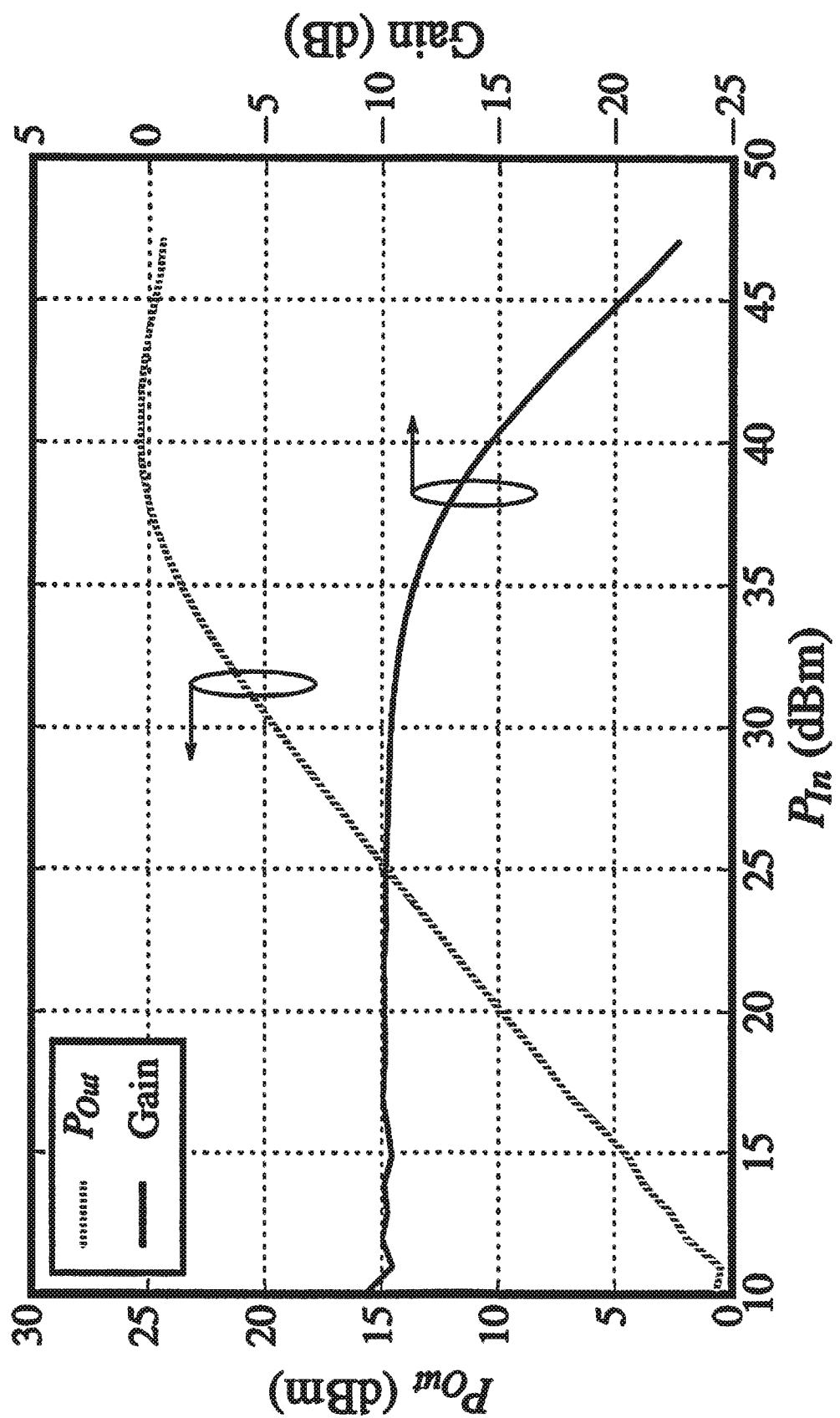
FIG. 16 is a graph showing the measured input/output power of an attenuator/limiter according to an embodiment of the present disclosure.

FIG. 16 is a graph showing the measured input/output power of the attenuator 28 with a Continuous Waveform (CW) 1 GHz tone. The maximum measured output power is almost identically 26 dBm with a corresponding input power of 10 W (40 dBm). Compression of the non-linear resistors is apparent with a sharply increasing attenuation (decreasing gain) through the network after 30 dBm.

A spike-leakage measurement was performed on a limiter with an attenuation of 3 dB. The pulse width was set to 1 µs and 1% duty cycle with an RF frequency of 1 GHz. A detector was used at the output with an oscilloscope to measure the time domain pulse response through the attenuator/limiter. A single pulse was measured at three different input powers. At any input power no spike was seen at the rising edge of the pulse. However, thermal heating decreased the $1_{sat}$ of the GaN resistors decreasing the allowed power through the element giving a peaking shape to the beginning of the pulse. As expected, 45 dBm had a much faster heating time than at 42 dBm.

Figure 17:
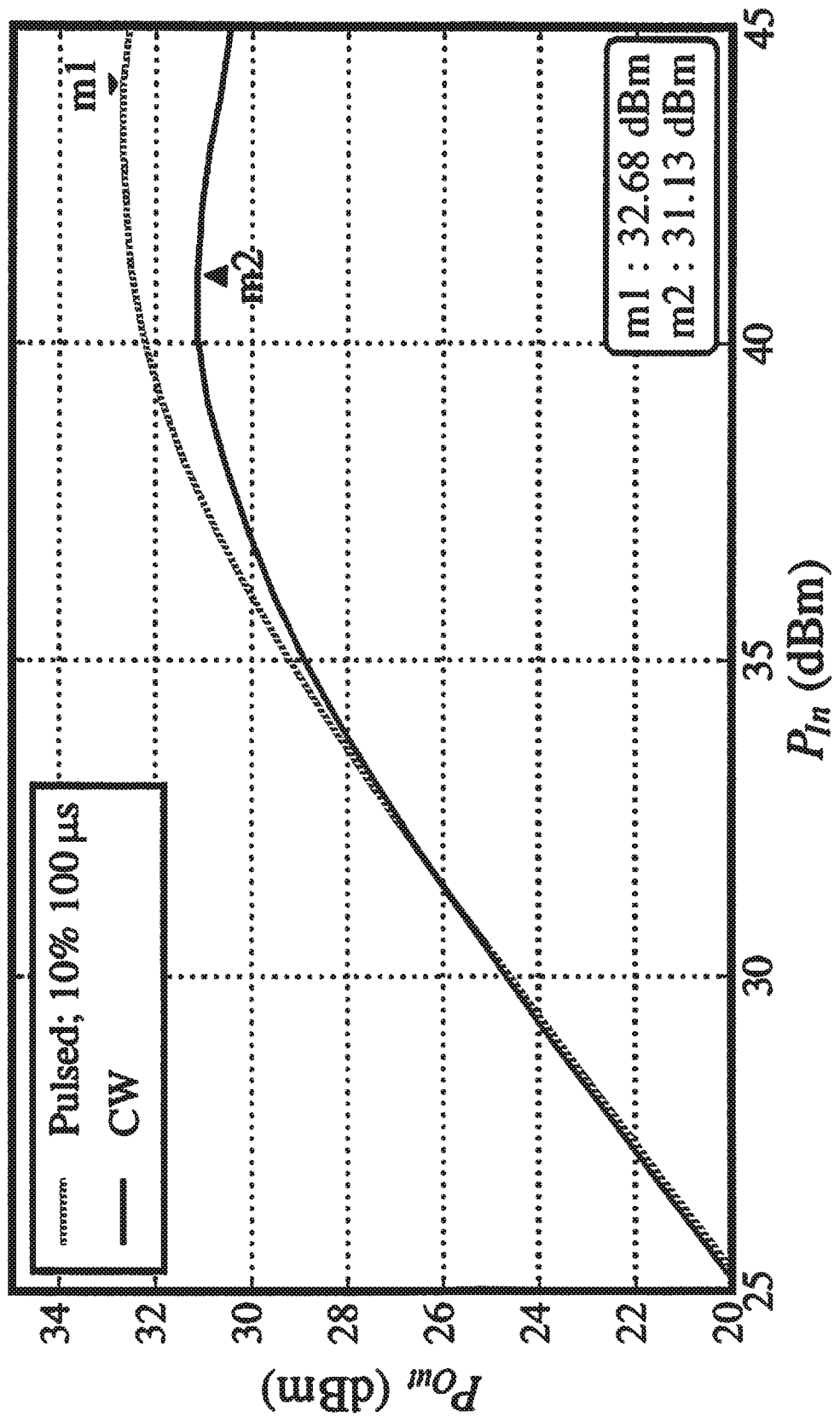
FIG. 17 is a graph showing Continuous Waveform (CW) and pulsed input versus output power curves of an attenuator/limiter according to an embodiment of the present disclosure

FIG. 17 is a graph showing CW and pulsed input versus output power curves for a 5 dB attenuator/limiter with a nominal limiting power of 33.3 dBm. Heating of the resistors causes the saturation current to drop, as can be seen in this figure. The pulsed case indicates a higher saturation current can be achieved with a lower average dissipated power. Measuring the DC-IV curves under pulsed condition would give IV curves without the effect of self-heating and thereby giving a maximum $1_{sat}$ and upper bound for the limiting power for a resistive attenuator. In addition, a pulsed IV curve would be very useful for fitting a nonlinear model. Nonlinear models for GaN resistors have been investigated in the past and can easily be applied to the use case here for precise design over power and temperature.

The attenuator/limiters described herein could be used to reduce system gain while reducing return loss at the same time. They could also be used as a rough high power limiter with a lower flat leakage output power limiter following, implemented as diodes or another topology.

Those skilled in the art will recognize improvements and modifications to the present disclosure. All such improvements and modifications are considered within the scope of the concepts disclosed herein.

The invention claimed is:

1. A monolithic attenuator and limiter circuit, comprising:
   an input terminal;
   an output terminal;
   a first resistor having a first terminal coupled to the input terminal and a second terminal coupled to the output terminal; and
   a second resistor having a first terminal coupled to the first or second terminal of the first resistor and a second terminal coupled to ground, wherein at least the first resistor is a non-linear resistor.

2. The monolithic attenuator and limiter circuit of claim 1 wherein the second resistor comprises a linear resistor.

3. The monolithic attenuator and limiter circuit of claim 1 wherein the second resistor comprises a non-linear resistor.

4. The monolithic attenuator and limiter circuit of claim 1 wherein the second resistor is coupled between the first terminal of the first resistor and ground and wherein the circuit further comprises a third resistor coupled between the second terminal of the first resistor and ground.

5. The monolithic attenuator and limiter circuit of claim 4 wherein the second resistor comprises a linear resistor.

6. The monolithic attenuator and limiter circuit of claim 5 wherein the third resistor comprises a linear resistor.

7. The monolithic attenuator and limiter circuit of claim 5 wherein the third resistor comprises a non-linear resistor.

8. The monolithic attenuator and limiter circuit of claim 4 wherein the second resistor comprises a non-linear resistor.

9. The monolithic attenuator and limiter circuit of claim 8 wherein the third resistor comprises a linear resistor.

10. The monolithic attenuator and limiter circuit of claim 8 wherein the third resistor comprises a non-linear resistor.

11. The monolithic attenuator and limiter circuit of claim 1 wherein the first resistor and a third resistor are connected in series between the input terminal and the output terminal and wherein the second resistor is coupled to the terminal of the first resistor that is connected directly to the third resistor.

12. The monolithic attenuator and limiter circuit of claim 11 wherein the second resistor comprises a linear resistor.

13. The monolithic attenuator and limiter circuit of claim 12 wherein the third resistor comprises a linear resistor.

14. The monolithic attenuator and limiter circuit of claim 12 wherein the third resistor comprises a non-linear resistor.

15. The monolithic attenuator and limiter circuit of claim 11 wherein the second resistor comprises a non-linear resistor.

16. The monolithic attenuator and limiter circuit of claim 15 wherein the third resistor comprises a linear resistor.

17. The monolithic attenuator and limiter circuit of claim 15 wherein the third resistor comprises a non-linear resistor.

18. The monolithic attenuator and limiter circuit of claim 1 further comprising an amplifier circuit having an amplifier output and having an amplifier input connected to the output terminal of the monolithic attenuator and limiter circuit.

19. The monolithic attenuator and limiter circuit of claim 18 wherein the amplifier circuit comprises a Radio Frequency (RF) amplifier.

20. The monolithic attenuator and limiter circuit of claim 18 wherein the amplifier circuit comprises a microwave frequency amplifier.

21. The monolithic attenuator and limiter circuit of claim 18 wherein the amplifier circuit is constructed using a same process as the monolithic attenuator and limiter circuit.

22. The monolithic attenuator and limiter circuit of claim 21 wherein the amplifier circuit and the monolithic attenuator and limiter circuit are fabricated on a same wafer die.

23. A linearized amplifier, comprising:
an input terminal;
an output terminal;
an amplifier circuit having an input coupled to the input terminal and an output coupled to the output terminal; and
a non-linear resistor having a first terminal coupled to the input terminal and a second terminal coupled to ground;
wherein the non-linear resistor presents an impedance to ground which increases as an input level of the input terminal increases.

24. The linearized amplifier of claim 23 wherein the non-linear resistor linearizes the linearized amplifier by reducing a gain of the amplifier circuit at a low input level without limiting the gain at a higher input level.

25. The linearized amplifier of claim 23 wherein the non-linear resistor compensates for slow gain compression in the amplifier circuit.

* * * * *